United States Patent [19]

Nagesh et al.

[11] Patent Number: 5,045,526

[45] Date of Patent: Sep. 3, 1991

[54] MAKING INSULATED SUPERCONDUCTOR WIRE

[75] Inventors: V. K. Nagesh, Cupertino; Daniel J. Miller, Sausalito, both of Calif.

[73] Assignee: Hewlett-Packard Company, Palo Alto, Calif.

[21] Appl. No.: 56,563

[22] Filed: May 29, 1987

Related U.S. Application Data

[63] Continuation-in-part of Ser. No. 34,867, Mar. 6, 1987.

[51] Int. Cl.$^5$ .................. H01L 39/12; C03C 25/02; H01B 12/00
[52] U.S. Cl. .......................... 505/1; 505/704; 505/739; 505/740; 505/742; 65/3.2; 174/125.1
[58] Field of Search ............. 29/599; 505/1, 704, 505/739, 740, 742; 65/3.2, 60.5, 60.53; 174/125.1, 110 R, 110 A

[56] References Cited

U.S. PATENT DOCUMENTS 3,489,604  1/1970  Benz et al. ............... 29/599
4,693,865  9/1987  Goto ...................... 420/572

Primary Examiner—Norman Morgenstern
Assistant Examiner—Margaret Bueker

[57] ABSTRACT

A method for producing insulated superconductor wire including the steps of a tubular glass preform, filling it with a superconductor material, suspending the preform within an oven to heat a section of the preform to approximately its softening point, and drawing the softened preform into a superconductor wire. A plastic coating can be applied to the wire to increase its durability. The completed wire preferably includes a superconductor core having its superconductor phase aligned with the longitudinal axis of the wire, a glass coating over the superconductor core, and a plastic coating over the glass coating.

4 Claims, 5 Drawing Sheets

MAKING INSULATED SUPERCONDUCTOR WIRE

CROSS-REFERENCE TO RELATED APPLICATIONS

This patent application is a continuation-in-part of copending patent application Serial No. 034,867, filed Mar. 6, 1987 on behalf of Nagesh et al,, and entitled "Superconductor Wires, Capillaries, Cables, and Methods for Making Same."

BACKGROUND OF THE INVENTION

1. Field of the Invention

This invention relates generally to methods for making insulated wires, and more particularly to methods for making insulated superconductor wires.

2. Description of the Related Art

The phenomenon of superconductivity was discovered by K. H. Onnes in 1911 when he demonstrated that the electrical resistance of mercury drops to zero when it is cooled to approximately 4° Kelvin (K) above absolute zero temperature. For many years the phenomenon remained a scientific curiosity, with few practical uses.

Theoretically, superconductivity has many potential uses. For example, superconducting power lines save a great deal of energy which is otherwise dissipated during transmission. Superconducting magnets, generators, and motors are small and extremely powerful. Superconducting devices known as Josephson junctions are extremely fast electronic switches having very low power consumption. In fact, the potential uses for superconducting materials are so many and varied, that an attempt make a comprehensive list of possible applications is almost an exercise in futility.

Despite the potential benefits of superconducting devices and structures, in the past they were seldom found outside of research laboratories because it was too expensive to cool most materials to their superconducting transition temperature $T_c$. This was due to the fact that, prior to early 1987, all known superconductor materials had a transition temperature within a few dozen degrees Kelvin of absolute zero, requiring the use of expensive liquid helium cooling systems.

On Mar. 2, 1987, M. K. Wu et al. published a paper entitled "Superconductivity at 93 K in a New Mixed-Phase Y—Ba—Cu—O Compound System at Ambient Pressure" in Physical Review Letters, Volume 58, Number 9. This announcement caused considerable excitement in the scientific and business communities because, for the first time, a superconductor material had been discovered which could use liquid nitrogen as a coolant. Since liquid nitrogen cooling systems are at least an order of magnitude less expensive than liquid helium cooling systems, many applications for superconductors suddenly became practical after Wu et al.'s discovery.

The superconductor material YBaCuO has a ceramic-type structure which brittle and hard to work with. For this reason, the related art fails to teach a method for making economical, durable superconductor wire from YBaCuO or related substances.

SUMMARY OF THE INVENTION

An object of this invention is to provide an economical and efficient method for making superconductor wire.

Another object of this invention is to provide an electrically insulated superconductor wire.

Briefly, the method of the present invention includes the steps of: forming a tubular, glass preform; filling the preform with powdered superconductor; heating a narrowed, neck portion of the preform; and drawing upon the softened neck portion of the preform to form a glass coated superconductor wire. A plastic coating can be applied over the glass coating to increase the durability of the wire.

The wire made by the method described above includes a superconductor core, a glass coating surrounding the core, and a plastic coating applied over the glass coating. As the glass preform was drawn upon to form the glass coating, the powdered superconductor was drawn along with it to form the superconductor core. The drawing process automatically aligns the lath-like structure of the superconductor phase of the core with the longitudinal axis of the wire.

An advantage of this invention is that an economical and efficient method is disclosed for making superconductor wire using currently available fiber optic technologies and equipment.

Another advantage of this invention is that it provides an insulated superconductor wire.

Yet another advantage of this invention is that the method of this invention can also be used to produce glass-coated, non-superconductor wire.

These and other objects and advantages of the present invention will become apparent to those skilled in the art after reading the following descriptions and studying the various FIGURES of the drawing.

DETAILED DESCRIPTION OF THE PREFERRED EMBODIMENTS

The preferred embodiments of the present invention will be discussed in terms of the new YBaCuO class of high temperature superconductors that were discovered by Wu et al., supra. However, it should be apparent to those skilled in the art that the methods and structures described herein could be practiced with a wide variety of superconducting materials, many of which are yet to be discovered, as well as to room temperature conductors, such as copper, aluminum, iron, and silver.

As is explained in detail in the Wu et al. paper, YBaCuO is a specific example of a compound system which is generally represented by $(L_{1-x}M_x)_aA_bD_y$, where $L=Y$, $M=Ba$, $A=Cu$, $D=O$, $x=0.4$, $a=2$, $b=1$, and $y<=4$. Other, related high $T_c$ superconductors within the above general representation include LaBaCuO and LaSrCuO.

YBaCuO is typically prepared from mixtures of high purity $Y_2O_3$, $BaCO_3$, and CuO powders. The powders are mixed in a binder, such as methanol or water, and subsequently heated to 100° C. to evaporate the binder. The resultant mixture is then heated for six hours in air at 850° C. to produce a dark green powder. The green powder is then heated for an additional six hours at 1000° C. to become a black, porous solid. A detailed explanation of the method steps involved in the manufacture of superconducting YBaCuO and a description of some of its properties can be found in a paper entitled "Superconductivity and Magnetism in High-$T_c$ Superconductor YBaCuO", J. Z. Sun, et al., Department of Applied Physics, Stanford University, PACS #: 74.30.-E, 74.70.-B.

Figure 1:
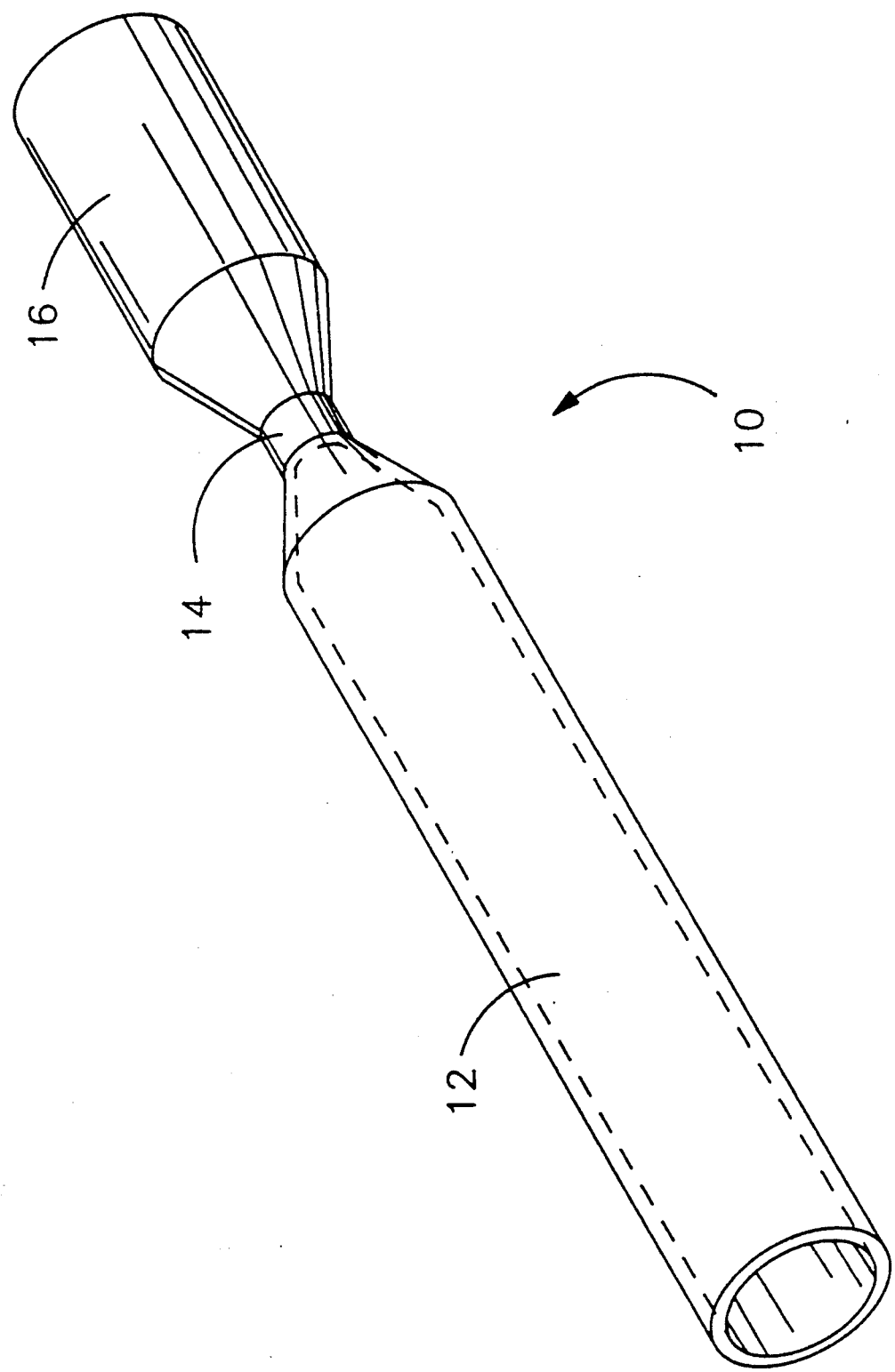
FIG. 1 is a perspective view of a glass preform of the present invention.

Referring to FIG. 1, a glass preform 10 can be manufactured by conventional techniques, such as blow molding. The preform includes a tubular body portion 12, a constricted neck portion 14, and a solid head portion 16.

As used herein, "glass" means any material having glass-like structure, such as quartz, borosilicate, aluminosilicate, etc. As an example, the preform 10 can be made from a quality, high temperature glass, such as Pyrex TM, which is manufactured by the Corning Glass Company.

Figure 2:
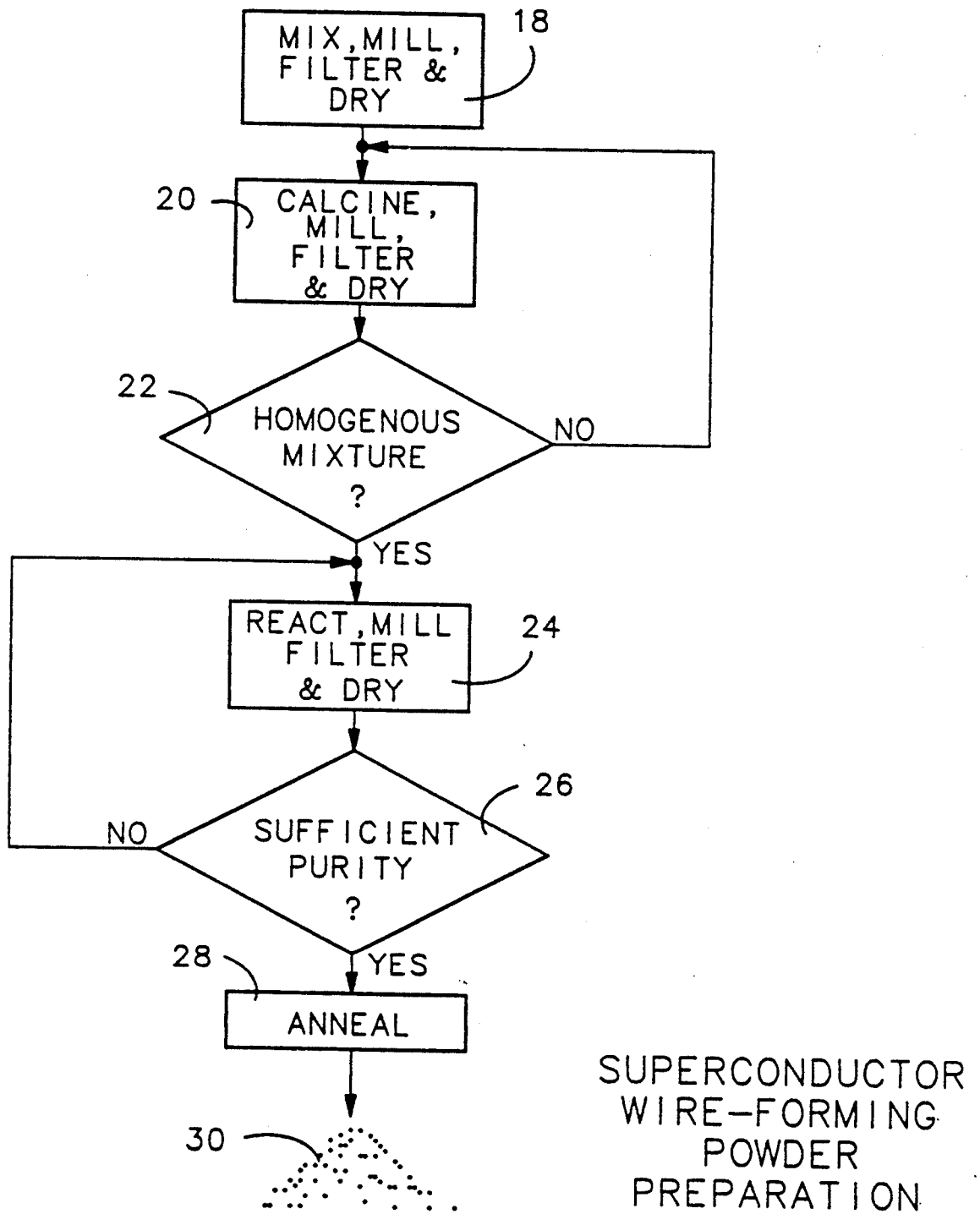
FIG. 2 is a flow diagram of a method for making wire-forming powder in accordance with the present invention.

In FIG. 2, a method for making a wire-forming powder is illustrated in block diagram form. As a first step 18, $Y_2O_3$, BaO or $BaCO_3$, and CuO are mixed in the proportions of 15:53:32, ball milled for 1–12 hours, filtered, and air dried. Other suitable mixture proportions include 24:42:34 and 18.5:65:16.5.

In a second step 20, the resultant mixture is calcined (i.e. reduced to a powder by heat) at a temperature of 800–850° C. for 4–16 hours, ball milled, filtered and air dried again. At a step 22, if, under microscopic examination, the mixture does not appear to be homogenous enough, the calcining, milling, filtering, and drying of step 20 is repeated.

Next, in a step 24, the dried powder is "reacted" by heating it for 2–16 hours at 850–1000° C., after which it is ball milled, filtered and dried. The resulting powder should contain a high proportion of superconductor phase. If, as determined in a step 26, it is determined that the powder is insufficiently pure (for example, less than 90% superconductor phase), the step 24 may be repeated. Chemical analysis indicates that such a superconducting phase to be characterized by the formula $Ba_2YCu_3O_{6-8}$, which is superconducting at temperatures below 88° K.

After sufficiently pure powder is obtained, it is annealed at 400° C. for 2–12 hours in a step 28. The process optimizes the oxygen content of the material, which may have lost oxygen content during the reaction of step 24. The result of process steps 18–28 is a quantity of superconductor wire-forming powder 30.

Figure 3:
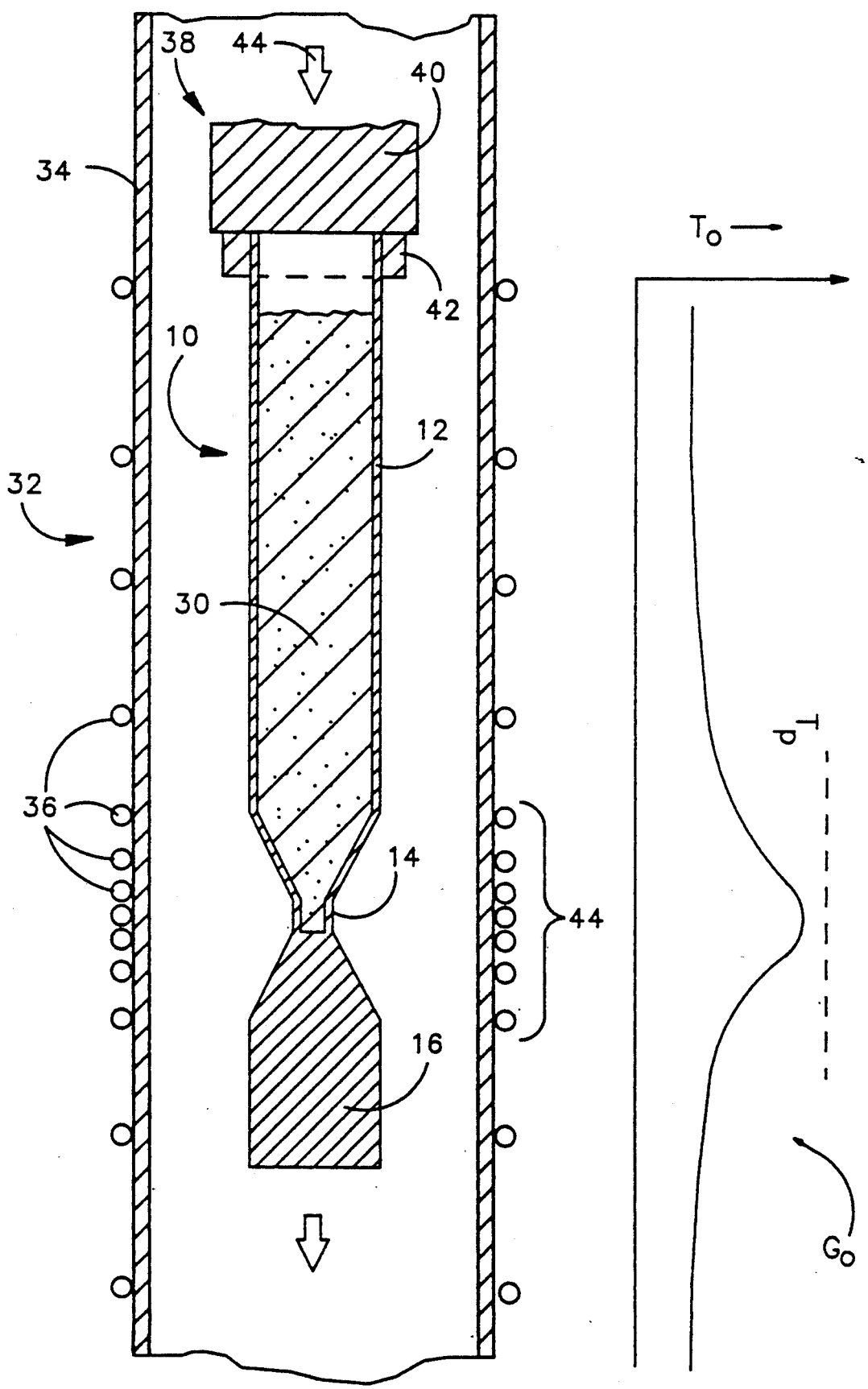
FIG. 3 is a simplified, cross-sectional view of an oven portion of an apparatus for making superconducting wire from the glass preform of FIG. 1 and the wire-forming powder of FIG. 2.

With reference to FIG. 3, the tubular body portion 12 of glass preform 10 is partially filled with wire-forming powder 30 and is suspended within a oven 32 including a casing 34, an electrical resistance coil 36, and a power source (not shown) coupled to the coil 36. A feed mechanism 38 includes a post 40, and a chuck 42 attached to the base of post 40. The end of preform 10 is held by chuck 40 such that the preform 10 is suspended in the center of the casing 34 of oven 32. The post 40 and chuck 42 can move downwardly as indicated by an arrow 44, thereby lowering preform 10 into the oven.

The heat generated by resistance coil 36 is transmitted to the preform 10 and the wire-forming powder 30, primarily by means of radiation. The casing 34 may be evacuated, or it may be filled with air or an inert gas, in which case there could be additional heating of the preform 10 by means of convection.

It should be noted that in the temperature graph $G_O$ that the temperature $T_O$ within oven is non-linear. This can be accomplished, for example, by increasing the density of the windings of the resistance coil 36, such as along an area 44 on the casing 34. By properly adjusting the temperature $T_O$ within oven, the temperature of the glass preform 10 at neck portion 14 can be raised to approximately the softening temperature $T_P$ of the preform. This causes a sufficient softening of the neck region 14 such that a glass coated superconductor wire can be drawn from the preform 10 and powder 30.

Figure 4:
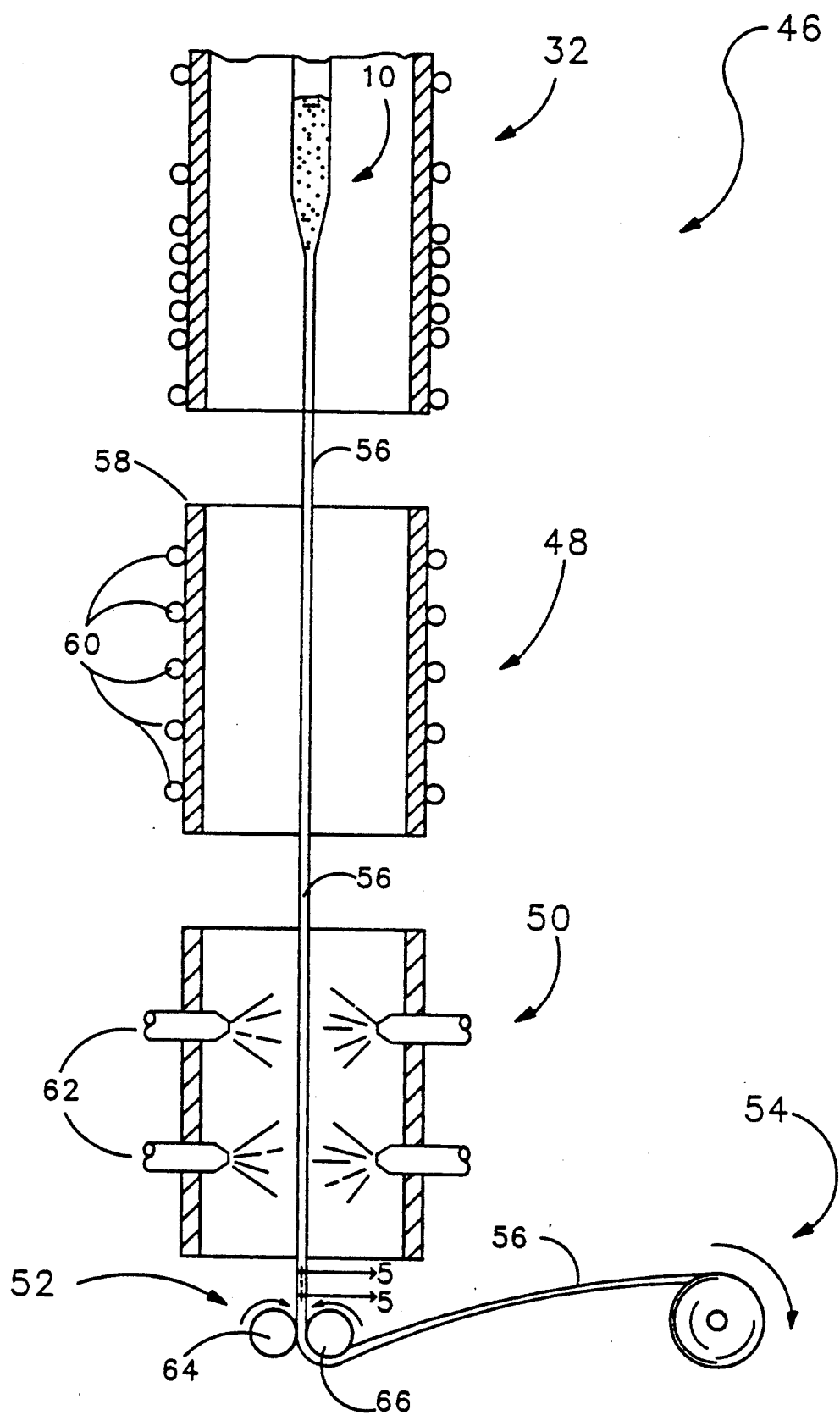
FIG. 4 is a simplified, cross-sectional view of the wire making apparatus.

Referring now additionally to FIG. 4, a method for making wire will be discussed in terms of a wire-forming apparatus 46. Besides the aforementioned oven 32, the apparatus 46 includes an annealer 48, a coater 50, a drawing mechanism 52, and a spooler 54. When starting the wire making process, the resistance coil 36 causes the neck 14 to soften by raising its temperature to near the softening point $T_P$ of preform 10. The solid head portion 16 of preform 10 acts as a weight to pull a strand of wire 56 from neck portion 14. As the preform 10 and powder 30 are consumed by this action, the post 40 is slowly lowered into oven 36 so that a constricted neck portion is always aligned with the high-temperature area 44. Once the wire 56 is long enough, the head portion 16 is removed from the wire, and the drawing mechanism 52 is used to provide the necessary pulling action to continue the wire drawing process.

In order to improve the characteristics of the wire 56, the wire 56 can be drawn through an annealer 48 including an enclosure 58 and a resistance coil 60 coupled to an electrical power supply (not shown). The wire 56, as before, is primarily heated by radiation and may be supplementally heated by convection.

The temperature within annealer 48 is considerably more constant than the temperature within oven 32. It is desirable to keep the temperature within annealer 48 well below the melting temperature of the preform 10, but high enough to ensure the development of a continuous superconducting phase. A suitable temperature for the annealer 48 is approximately 600–850° C. An additional annealer (not shown) at a temperature of approximately 400° C. can be used to optimize the oxygen content of the superconductor material as discussed previously.

The durability of the superconductor wire 56 can be improved by running the wire through a coater 50. The coater 50 includes a number of spray heads 62 which are coupled to a pressurized source of coating material (not shown). Typically, an organic coating comprising a suitable thermoplastic is used as a coating material, both to protect the glass exterior of the wire 56 from scratches, and to provide a hermetic seal for the somewhat porous glass coating of the wire.

The drawing mechanism 52 can include a pair of pinch rollers 64 and 66 which rotate in opposite directions, as indicated. One or both of pinch rollers 64 and 66 are driven by a driving mechanism, such as an electrically-powered stepper motor (not shown).

After exiting the pinch rollers 64 and 66, the wire 56 is wound around the reel of spooler 54. The driving mechanism for the reel can be any suitable device such as an electrically-powered stepper motor (also not shown).

It should be noted that the spooler 54 could be used to draw the wire 56 directly from the from the preform 10. However, the use of a separate drawing mechanism 52 is preferable, since a more constant drawing speed can be maintained, and because it allows the reel of spooler to be changed without the stopping the wire making process.

Figure 5:
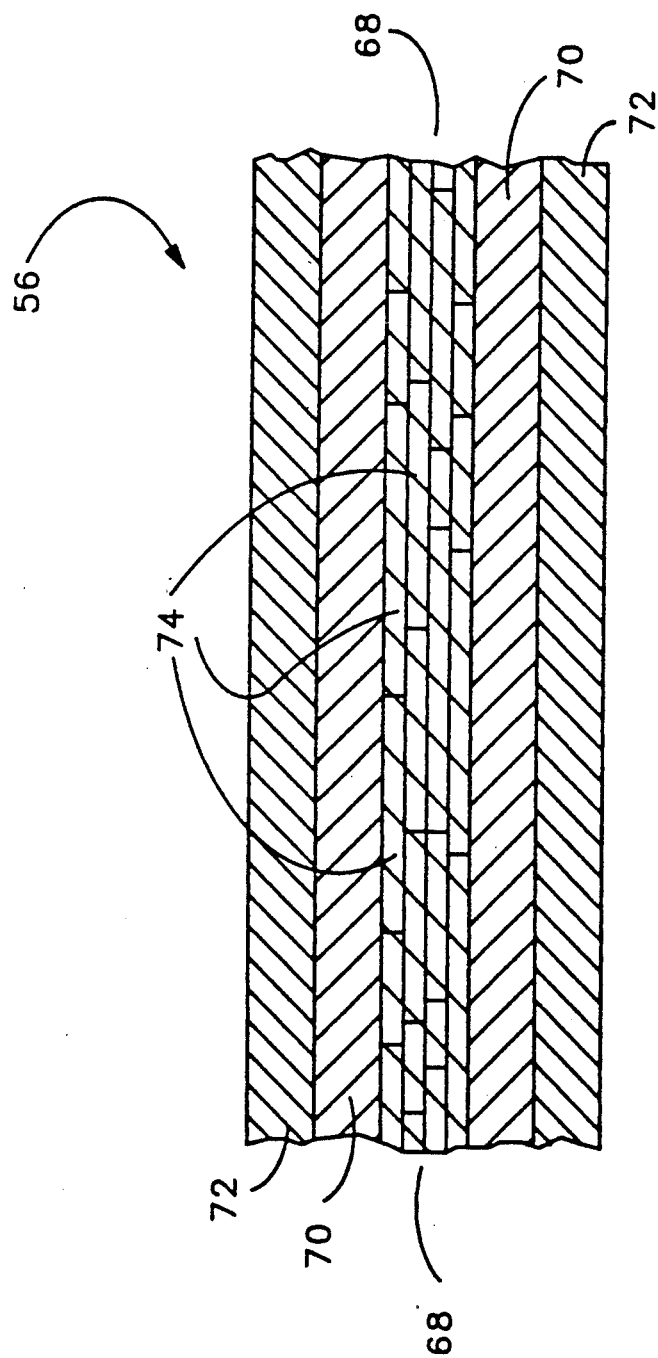
FIG. 5 is a longitudinal cross-section taken along line 5—5 of FIG. 4 which illustrates the structure of a superconductor wire made by the apparatus of FIG. 4.

In FIG. 5, a longitudinal cross-section of wire 56 includes a wire core 68, an insulating glass coating 70, and a protective plastic coating 72. The core 68 is sintered wire-forming powder 30, while the glass coating 70 is drawn from the glass preform 10. The plastic coating 72 is applied by coater 50.

The wire 56 is drawn continuously from the softened preform 10 within oven 32. As the preform 10 is drawn, the wire-forming powder 30 is drawn along with it. As the wire-forming powder 30 is drawn, it forms long, flat platelet or lath structures 74, which are superconducting both longitudinally and laterally. Therefore, the act of drawing the wire-forming powder 30 into the wire core 68 automatically aligns the longitudinal superconducting direction of lath structures 74 with the desired direction of current flow, i.e. along the longitudinal axis of core 68.

By carefully selecting the material of preform 10, and therefore its softening temperature TP, the process can be even more finely controlled. If, for example, a preform 10 is selected which has a softening temperature lower than the melting temperature of the wire-forming powder 30, the powder will not melt within the oven 32, but rather will sinter and/or anneal to form the superconductor phase 74. If, on the other hand, a preform 10 is selected having a softening temperature higher than the melting temperature of the wire-forming powder 30, the powder will melt within the oven 32 and recrystallize into its superconductor phase 74.

The diameter of the brittle portions of the wire 56, i.e. the core 68 and glass coating 70, should be kept small (for example, 50 mils) to maintain flexibility. The plastic coating 72, being much more flexible than either the core or the glass coating, can be thicker. If, for example, the glass coating 70 has a wall thickness of 5 mils, the core 68 can have a diameter of approximately 40 mils.

Specific details in the making of glass optical fibers can be found in an article entitled "Drawing Lightguide Fiber", by D. H. Smithgall et al., The Western Electric Engineer, Winter 1980, pp. 49+, which is hereby incorporated by reference. A description of how to make capillaries from preforms can be found in U.S. Pat. No. 4,293,415 of Bente, III et al.; in "Optical Transmission in Liquid Core Quartz Fibers", by Stone, Applied Physics, April 1972, pp. 78-79; and in "Construction of Long Lengths of Coiled Glass Capillary" by Desty et al., Analytical Chemistry, vol. 32, no. 2, Feb. 1960, pp. 302-304, which are also hereby incorporated by reference.

A wire 56 having a core 68 made from YBaCuO will have to be cooled to approximately 93° K in order to become superconducting. A wire 56 having a core 68 made from an ordinary conductor, such as copper, can be used at ordinary room temperatures.

A wire 56 can be used singly, or can be combined with other wires 56, with ordinary conductors, and/or with insulating fibers to form a cable. The wires 56 within a superconducting cable can be cooled by a number of methods including immersion in liquid nitrogen, intertwining with capillaries or tubes carrying liquid nitrogen, etc.

While this invention has been described with reference to a single, preferred embodiment, it is contemplated that various alterations and permutations of the invention will become apparent to those skilled in the art upon a reading of the preceding descriptions and a study of the drawing. It is therefore intended that the scope of the present invention be determined by the following appended claims.

What is claimed is:

1. A method for making insulated superconductor wire comprising the steps of:
   preparing an oxide based superconductor wire-forming powder;
   at least partially filing a hollow glass preform with said powder;
   drawing a glass insulated superconductor wire structure from said preform and said powder to produce a superconductor core surrounded by a glass sheath; and
   annealing said glass insulated wire structure in an oxygen-bearing atmosphere to cause oxygen to permeate said glass sheath and enter said superconductor core.

2. A method for making insulated superconductor wire as recited in claim 1 wherein said powder includes superconductor precursor material.

3. A method for making insulated superconductor wire as recited in claim 1 wherein said powder includes a superconductor material.

4. A method for making insulated superconductor wire as recited in claim 1 further comprising the step of coating said glass sheath with an organic sealant.

* * * * *